DIFFERENTIAL AMPLIFIER INCLUDING CROSS-COUPLING MEANS AND AN ADJUSTABLE DEAD BAND
Filed Aug. 2, 1962
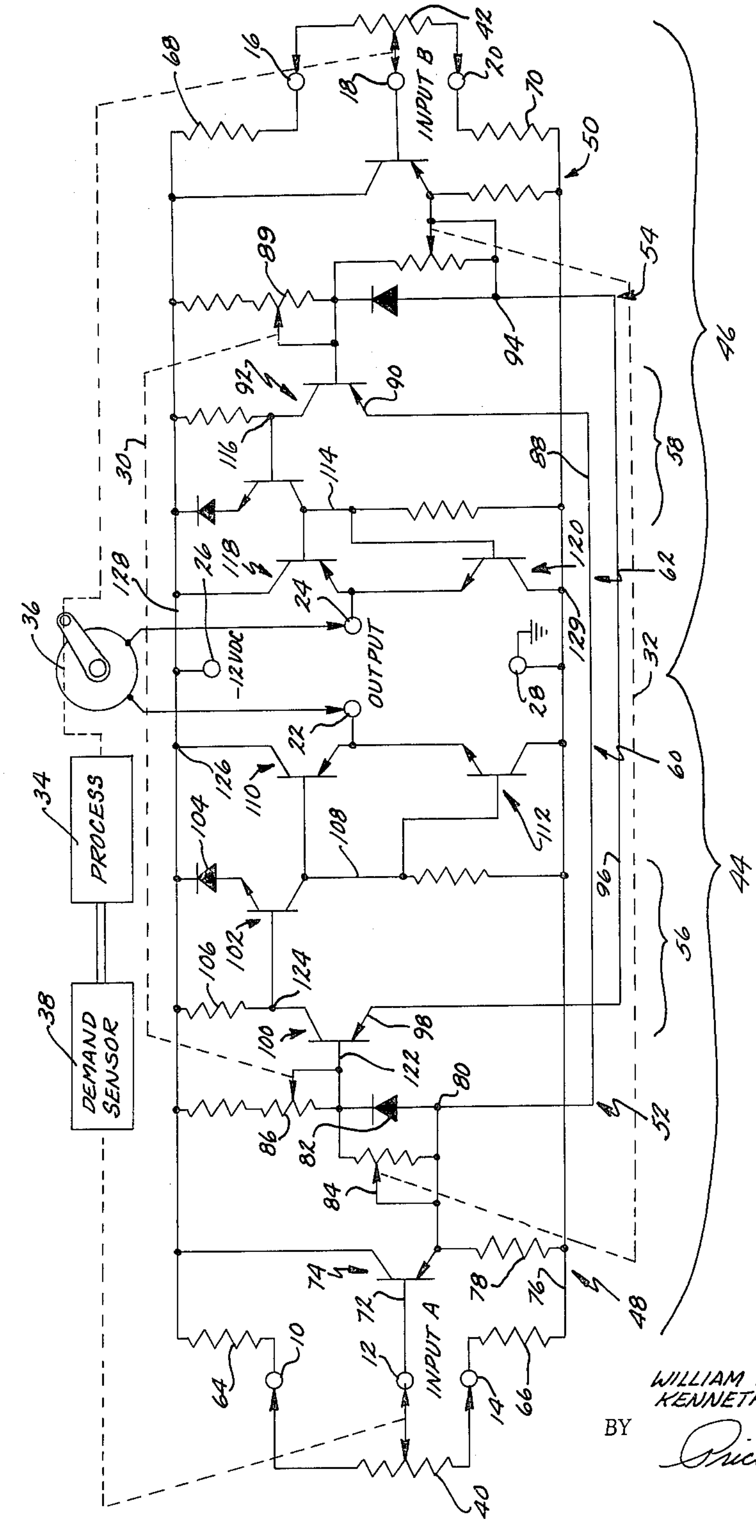
INVENTORS
WILLIAM R. DUFENDACH
KENNETH R. BLANDING
BY
Price & Heneveld
ATTORNEYS

United States Patent Office 3,255,418

Patented June 7, 1966

3,255,418

DIFFERENTIAL AMPLIFIER INCLUDING CROSS-COUPLING MEANS AND AN ADJUSTABLE DEAD BAND

William R. Dufendach, Grand Rapids, and Kenneth R. Blanding, Cedar Springs, Mich., assignors to Vari-Tech Company, Grand Rapids, Mich., a corporation of Michigan Filed Aug. 2, 1962, Ser. No. 214,266
4 Claims. (Cl. 330—13)

This invention concerns direct current differential amplifiers, and more particularly a differential amplifier whose response depends in no way on the absolute magnitude of the voltages whose difference it measures, and which is unusually stable and has good frequency response.

Differential amplifiers have been well-known in the past in many applications, such as, for example, servomechanisms in which a process parameter signal is used as one input, a process control signal as the other, and a process controlling device as the output. In the past, however, such devices were not only very complex and expensive, but were also adversely affected by variations in the power supply voltage, the frequency of signal variations of steepness of transient surges, and by the absolute magnitude of the voltages to be compared.

The present invention overcomes these disadvantages by providing a pair of identical amplifying circuits connecting the two inputs to the output and driving a pair of class B emitter-follower stages, each comprising a pair of push-pull connected transistors of complementary symmetry or conductivity type in such an manner as to control the current flow through the output in direction and magnitude through a circuit powered directly by the direct current power supply without any load other than the output load itself. Control of the emitter follower stages in accordance with the invention is achieved by amplifying stages whose gain is controlled by a pair of cross-coupling loops which mutually interconnect the two input amplifier systems so that the drive signal for the emitter followers is derived only from the difference between the two input voltages and does not in any way depend on their absolute magnitude. This feature results in uniform sensitivity of the differential amplifier throughout its entire useful range and makes the differential amplifier output practically insensitive to line voltage variations if calibrated input voltages are used.

It is the primary object of this invention to provide a simple, rugged differential amplifier whose output is dependent only upon the difference between the two input voltages and is not significantly affected by the absolute value of the input voltages nor by line voltage variations.

It is another object of this invention to provide a differential amplifier of the transistorized type which is largely insensitive to variations in humidity, and in which the effects of temperature variation are balanced out by the circuitry.

It is another object of this invention to provide a differential amplifier in which the width of the dead band, or range of effective zero differential, can be readily adjusted.

It is still another object of this invention to provide a direct current differential amplifier of the type described which has a very high frequency response.

These and other objects of the invention will become apparent from the following specification, taken in connection with the accompanying drawing in which the single figure is a circuit diagram showing the differential amplifier of this invention in one possible illustrative environment.

Basically, the circuit of this invention functions by providing a pair of circuits, connecting their outputs to the direct current power supply in either forward polarity or reverse polarity, and electronically switching from one circuit to the other by switching transistors controlled in accordance with signals derived from amplifying a signal representative of the difference between the two input voltages. This signal is in turn generated at each input by a class A amplifier which is connected to the other input by a cross-coupling loop in such a manner that the voltage so coupled cancels out the absolute value of the input voltages and causes the amplifier to amplify only the difference voltage, with due regard to its polarity. As an added feature, the circuit lends itself readily to a simple adjustment of its sensitivity to the dead bank, that is, the point where the two inputs are so nearly equal that the amplifier senses no effective difference between them, which adjustment is most useful in applications where hunting is apt to occur.

Referring now to the drawing, the differential amplifier of this invention consists of the circuitry included between the input terminals 10, 12, 14 and 16, 18, 20, the output terminals 22, 24 and the power supply terminals 26, 28. The balance control 30 and the sensitivity control 32, if used, may either be adjusted at the factory or may be mounted externally of the differential amplifier as particular applications may require.

In order to explain the functioning of the device, the circuit has been drawn, as a matter of illustration, in connection with a typical servomechanism in which a given parameter of a process 34 is controlled by a servomotor 36. A demand sensor 38 associated with the process 34 determines the value which the parameter should have and provides a corresponding demand voltage at input A, as for example by appropriately setting the slider of a potentiometer 40. As the servomotor 36 adjusts the parameter of process 34, it also moves the slider of potentiometer 42 at input B. As long as the voltages appearing at input A and input B are equal, there is no output to servomotor 36. As soon as the voltage at input A is varied, however, the servomotor 36 is energized and causes the potentiometer 42 to follow the movement of potentiometer 40 until their positions are once again equal.

The differential amplifier of this invention consists of two identical sections 44, 46. Each of the sections 44, 46 contains an impedance matching stage 48, 50, respectively; a stabilizer stage 52, 54, respectively; a class A amplifier portion 56, 58, respectively; and an emitter follower output signal-generating stage 60, 62 respectively, each of which comprises a pair of transistors connected in complementary symmetry push-pull and operated class B. Range limiting resistors 64, 66, 68, 70 are provided to prevent operation of the device at the extreme limits of its range at which its operation would no longer be linear due to the operational characteristics of the impedance matching transistors. In the example chosen, in which the power supply is 12 volts D.C., the useful range of the device would lie between approximately 1½ and 10½ volts.

*Operation*

The circuit of this invention operates as follows: at a given setting of the slider of potentiometer 40, a given voltage is developed between the base 72 of transistor 74 and the ground bus 76. A voltage is correspondingly developed across the load resistor 78, and the magnitude of this voltage determines the potential at point 80. The stabilizing diode 82 normally reduces to a minimum the relatively narrow range of effectively equivalent voltages known as the dead band by providing a fixed voltage drop and preventing reverse current flow, but the effect of this diode may be mitigated or even eliminated if desired by shunting it through a variable resistance 84 which serves as the sensitivity adjustment 32.

The balance of the two inputs, i.e. the relative values of the input voltages which will produce a null condition, can be adjusted by varying the relative values of the resistors 86, 88, which may be either calibrated at the factory or may be made adjustable to form the balance control 30.

The potential appearing at point 80 is fed through the cross-coupling line 89 to the emitter 90 of transistor 92 in the amplifier circuit of input B. Likewise, the potential appearing at point 94 in the circuit of input B is fed through cross-coupling loop 96 to the emitter 98 of transistor 100 in the circuit of input A and it is this type of circuit connection to which the term "cross coupling" is applied throughout this specification. Transistor 100 serves as the first stage of a two-stage class A amplifier whose second stage is the transistor 102. A diode 104 is inserted in the grounded emitter circuit of transistor 102 to prevent an error signal being generated by leakage current through the load resistor 106 of transistor 100. The output of transistor 102 appears as a control signal in wire 108. This signal is used to operate the complementary symmetry push-pull emitter follower stage 60, composed of transistors 110, 112 by biasing the two transistors into opposite modes of operation. That is, depending on the value of the control signal in wire 108, transistor 110 may be conducting and transistor 112 cut off, or vice versa.

When the circuit is in equilibrium, the voltages in wires 108 and 114 are equal, and no current flows in the output circuit. If the voltage across input A now increases, as for example as a result of increased demand for the parameter of process 34, the potential at point 80 increases negatively. This increase increases the emitter potential of transistor 92, which reduces the current flow through transistor 92 and increases the negative potential at point 116. This reduces the negative potential in line 114, which causes transistor 118 to cut off and transistor 120 to conduct.

On the other hand, the rise in potential at point 80 raises the potential at base 122 of transistor 100. This in turn lowers the potential at point 124 and correspondingly increases the potential at 108. This increase in the control signal of the emitter follower 60 causes transistor 112 to cut off and transistor 110 to conduct. This causes a circuit to be established from point 126 on the negative bus 128 through transistor 110, output terminal 22, servomotor 36, output terminal 24, and transistor 120 to point 129 on the ground bus 76. Inasmuch as it takes anly a small increase in the base voltage of transistor 110 or a small decrease in the base voltage of transistor 120 for these transistors to become saturated, the total linear operating range is on the order of ±30 mv. in the preferred embodiment. The small ranges of voltage during the period these transistors are not saturated add to the condition of true null produced by absolute input voltage equality to form the complete dead band, upon which operates the sensitivity control 32. It will be seen from the above description that if the voltage at input A is greater than the voltage at input B, the output will be energized in such a manner as to polarize output terminal 22 negatively with respect to output terminal 24. Inasmuch as the sections 44 and 46 are completely symmetrical, it will be understood that if the voltage at input A drops below the voltage at input B, the output will be energized in the reverse direction, with terminal 24 becoming negative with respect to terminal 22.

In the example chosen, the energization of servomotor 36 with the proper polarity will cause it to adjust the parameter of process 34 to satisfy the sensed demand, and at the same time will move the slider of potentiometer 42 until the voltage at input B once again equals the voltage at input A to indicate that the sensed demand has been satisfied.

*Uses and advantages*

It will be understood from the foregoing discussion that the output at terminals 22, 24 has a polarity dependent on the relative size of the input voltages at A and B, and a magnitude depending within narrow limits on the magnitude of the difference between the two input voltages, and outside of those limits on the power supply voltage alone. Consequently, the output of the differential amplifier of this invention is not affected in any way by the absolute magnitudes of the input voltages at A and B, nor is it affected significantly by variations in the power supply voltages, particularly when the input voltages at A and B are small.. Consequently, the differential amplifier of this invention is not significantly affected by ripple in the D.C. power supply.

It will be understood that although the circuit has been described in connection with a servo loop, it may equally well be used for any other purpose in which a difference between two inputs has to produce an output of appropriate polarity. Thus, the inputs may be potentiometers, reference voltages, or other voltage sources, and the output may be used to control motor speeds, trigger silicon controlled rectifiers, operate digital counters, or control other devices as desired.

Inasmuch as the cross-coupling between the inputs eliminates the effect of the absolute magnitude of the input voltages, nulling within a range of 5 millivolts in a typical example of this circuit is possible throughout the entire useful range of the differential amplifier. In the same illustrative embodiment, it is possible to vary the previously defined dead band from the 5 millivolt range in the example just given to a maximum range of approximately 250 millivolts by adjusting the sensitivity control 32 where hunting of the output load is a problem. The circuit of this invention, on the other hand, is highly adaptable to all-electronic control applications in which input voltage variations are very rapid, because the complete absence of inductive or capacitive components in the differential amplifier make it capable of very high frequency response.

Because of the symmetry of the sections 44 and 46, the temperature effects on the transistors of the differential amplifier cancel each other out, so that the amplifier is highly temperature-stable even though no specially selected transistors are used. Also, the entire circuit of the differential amplifier is of low impedance (in a typical illustrative example, the highest resistance in any stage is 10,000 ohms), and the device of this invention is therefore largely impervious to humidity variations.

It will be seen from the foregoing discussion that the present invention provides a highly effective, rugged and accurate differential amplifier which is unaffected by absolute values of the input voltages and by voltage variations in the power supply. Obviously, the principles taught in the above discussion can be carried out in many different ways of which the embodiment shown and described herein is merely illustrative. For this reason, we do not desire to be limited by the embodiment shown and described, but only by the scope of the following claims.

We claim:

1. A differential voltage amplifier, comprising: first and second input means for respectively receiving first and second input voltages; a first circuit means electrically coupled to said first input means and cross-coupled to said second input means; said first circuit means having a first output terminal and including means for producing a first voltage at said terminal that is representative of the first of said input voltages minus the second thereof; and a second circuit means electrically coupled to said second input means and cross-coupled to said first input means; said second circuit means having a second output terminal and including means for producing a second voltage at said second terminal that is representative of the second of said input voltages minus the first thereof; said first and second circuit means thereby providing between said first and second output terminals an electrical signal whose polarity and whose magnitude are each a function of the relative magnitudes of said input voltages; said first and second circuits each including a pair of amplifying stages coupled together by a stabilizing circuit means providing a fixed voltage drop, whereby the operation of each stage is stabilized and the dead band or range of effective amplifier output null is reduced in a predetermined manner.

2. A differential voltage amplifier, comprising: first and second input means for respectively receiving first and second input voltages; a first circuit means electrically coupled to said first input means and cross-coupled to said second input means; said first circuit means having a first output terminal and including means for producing a first voltage at said terminal that is representative of the first of said input voltages minus the second thereof; and a second circuit means electrically coupled to said second input means and cross-coupled to said first input means; said second circuit means having a second output terminal and including means for producing a second voltage at said second terminal that is representative of the second of said input voltages minus the first thereof; said first and second circuit means thereby providing between said first and second output terminals an electrical signal whose polarity and whose magnitude are each a function of the relative magnitudes of said input voltages; and a pair of stages one located between each of said output terminals and circuit means each stage including at least one pair of transistors of complementary conductivity type, with one of said output terminals connected between each of said pair of transistors; and each of said stages being controlled by one of the outputs of said first or second circuits such that the said transistors in each pair are controlled thereby and operate in opposite modes.

3. A differential voltage amplifier, comprising: first and second input means for respectively receiving first and second input voltages; a first circuit having a given amplification factor and coupled to said first input means and first input voltage; a second circuit having a like given amplification factor and coupled to said second input means and second input voltage; means for cross-coupling signals proportional to said second input voltage to said first circuit; means for cross-coupling signals proportional to said first input voltage to said second circuit; said first circuit producing an output representative of the first input voltage minus the second; said second circuit producing an output representative of the second input voltage minus the first; and output signal generating means coupled to said first and second circuit outputs; said output signal generating means having a pair of output terminals and producing across the same from said circuit outputs a final output signal whose polarity and whose magnitude are each a function of the relative magnitudes of said input voltages; said first and second circuits each including a pair of amplifying stages coupled together by a stabilizing circuit means providing a fixed voltage drop, whereby the operation of each stage is stabilized and the dead band or range of effective amplifier output null is reduced in a predetermined manner.

4. A differential voltage amplifier, comprising: first and second input means for respectively receiving first and second input voltages; a first circuit having a given amplification factor and coupled to said first input means and first input voltage; a second circuit having a like given amplification factor and coupled to said second input means and second input voltage; means for cross-coupling signals proportional to said second input voltage to said first circuit; means for cross-coupling signals proportional to said first input voltage to said second circuit; said first circuit producing an output representative of the first input voltage minus the second; said second circuit producing an output representative of the second input voltage minus the first; and output signal generating means coupled to said first and second circuit outputs; said output signal generating means having a pair of output terminals and producing across the same from said circuit outputs a final output signal whose polarity and whose magnitude are each a function of the relative magnitudes of said input voltages; and a pair of stages one located between each of said output terminals and circuit means, each stage including at least one pair of transistors of complementary conductivity type, with one of said output terminals connected between each of said pair of transistors; and each of said stages being controlled by one of the outputs of said first or second circuits such that the said transistor in each pair are controlled thereby and operate in opposite modes.

References Cited by the Examiner

UNITED STATES PATENTS

| | | | |
|---|---|---|---|
| 2,936,345 | 5/1960 | Kinkel | 330—74 |
| 3,077,566 | 2/1963 | Vosteen | 330—17 X |
| 3,078,379 | 2/1963 | Plogstedt et al. | 330—14 X |
| 3,092,783 | 6/1963 | Krohn | 330—69 X |
| 3,114,112 | 12/1963 | Cochran | 330—24 X |
| 3,156,873 | 11/1964 | Williams | 330—69 |

ROY LAKE, *Primary Examiner.*

NATHAN KAUFMAN, *Examiner.*

F. D. PARIS, *Assistant Examiner.*